United States Patent [19]
Mori

[11] Patent Number: 5,728,623
[45] Date of Patent: Mar. 17, 1998

[54] METHOD OF BONDING A III-V GROUP COMPOUND SEMICONDUCTOR LAYER ON A SILICON SUBSTRATE

[75] Inventor: Kazuo Mori, Tokyo, Japan

[73] Assignee: NEC Corporation, Tokyo, Japan

[21] Appl. No.: 405,104

[22] Filed: Mar. 16, 1995

[30] Foreign Application Priority Data

| Mar. 16, 1994 | [JP] | Japan | 6-045828 |
| Dec. 7, 1994 | [JP] | Japan | 6-303707 |

[51] Int. Cl.⁶ .................................. H01L 21/30
[52] U.S. Cl. .................. 438/455; 438/403; 438/406
[58] Field of Search ................. 437/61, 62, 974; 148/DIG. 12, DIG. 135; 438/455, 403, 405, 406

[56] References Cited

U.S. PATENT DOCUMENTS

| 4,891,329 | 1/1990 | Reisman et al. | 437/61 |
| 5,346,848 | 9/1994 | Grupen-Shemansky et al. | 437/974 |
| 5,439,843 | 8/1995 | Sakaguchi et al. | 437/62 |

FOREIGN PATENT DOCUMENTS

| 61-182215 | 8/1986 | Japan . |
| 61-183918 | 8/1986 | Japan . |
| 1-133341 | 5/1989 | Japan . |
| 1-283113 | 9/1989 | Japan . |
| 2-194519 | 8/1990 | Japan . |

OTHER PUBLICATIONS

S. Nishi et al., "Growth of Single Domain GaAs on 2-inch Si(100) Substrate by Molecular Beam Epitaxy", Japanese Journal of Applied Phyics, Jun. 1985, vol. 24, No. 6, pp. L391–L393.

M. Yamaguchi et al., "Analysis of strained-layer superlattice effects on dislocation density reduction in GaAs on Si substrates", Applied Physic Letters, Jan. 2, 1989, vol. 54, No. 1, pp. 24–26.

M. Tachikawa et al., "Dislocation generation of GaAs on Si in the cooling stage", Applied Physic Letters, May 28, 1990, vol. 56, No. 22, pp. 2225–2227.

M. Sugo et al., "Heteroepitaxial Growth of InP on Si Substrates", Journal of Crystal Growth, 1990, vol. 99, pp. 365–370.

Y. Lo, "Semiconductor lasers on Si substrates using the technology of bonding by atomic rearrangement", Applied Physic Letters, Mar. 8, 1993, vol. 62, No. 10, pp. 1038–1040.

H. Wada et al., "Direct wafer bonding between different semiconductor materials", Applied Physics, 1994, vol. 63, No. 1, pp. 53–56.

*Primary Examiner*—Trung Dang
*Attorney, Agent, or Firm*—Young & Thompson

[57] ABSTRACT

Prior to a heat treatment for bonding a III-V group compound semiconductor layer on a silicon substrate, a thermal stress relaxation layer is provided between the silicon layer and the III-V group compound semiconductor layer thermal stress relaxation layer, having a thermal expansion coefficient equal or near to the thermal expansion coefficient of the III-V group compound semiconductor layer and having a rigidity coefficient being sufficiently large to suppress generation of any crystal defects in the III-V group compound semiconductor layer due to a thermal stress generated in the heat treatment and subsequent cooling stage by the difference in the thermal expansion coefficient between the III-V group compound semiconductor layer and the silicon layer.

30 Claims, 2 Drawing Sheets

METHOD OF BONDING A III-V GROUP COMPOUND SEMICONDUCTOR LAYER ON A SILICON SUBSTRATE

BACKGROUND OF THE INVENTION

The present invention relates to a direct bonding method for bonding a III-V group compound semiconductor layer on a silicon substrate.

Recently, attention to a direct bonding method for of a III-V group compound semiconductor layer such as an InP layer on a silicon substrate has been on the increase in place of the heteroepitaxial growth. The heteroepitaxial growth has disadvantages in large lattice mismatch causing at high density crystal defects such as threading dislocations and in a large difference in thermal expansion coefficients which may provide a large thermal stress. The direct bonding method has been developed to prevent the above disadvantages of the heteroepitaxial growth, but the following serious problems still remains.

The bonding of the III-V group compound semiconductor layer requires a heat treatment at a relatively high temperature to cause atomic re-arrangements on a bonding interface for secure bonding. This high temperature heat treatment and subsequent cooling stage may raise another serious problems. The III-V group compound semiconductor layer has a large difference in thermal expansion from the silicon substrate. The heat treatment for bonding the III-V group compound semiconductor layer on the silicon substrate and subsequent cooling stage thereof may introduce a large thermal stress due to the difference in the thermal expansion coefficient between the III-V group compound semiconductor and the silicon substrate. The thermal stress may introduce various crystal defects such as dislocations into mainly the III-V group compound semiconductor layer acting as a device layer. The III-V group compound semiconductor layer having many crystal defects such as dislocations, particularly threading dislocations is not usable. If a low temperature heat treatment is carried out for bonding the III-V group compound semiconductor layer on the silicon substrate, it is difficult to obtain a necessary large bonding intensity.

It has been required to provide a novel method of bonding III-V group compound semiconductor layer on the silicon layer free from introduction of any crystal defects such as dislocations but is able to obtain a strong bonding intensity.

SUMMARY OF THE INVENTION

Accordingly, it is a primary object of the present invention to provide a novel method for bonding a III-V group compound semiconductor device on a silicon substrate.

It is another object of the present invention to provide a novel method for bonding a III-V group compound semiconductor device on a silicon substrate being able to prevent crystal imperfections of III-V group compound semiconductor layers.

It is yet another object of the present invention to provide a novel method for bonding a III-V group compound semiconductor device on a silicon substrate being able to secure a strong bonding intensity.

The above and other objects, features and advantages of the present invention will be apparent from the following descriptions.

The present invention provides a novel method for bonding a III-V group compound semiconductor layer to a silicon layer. The III-V group compound semiconductor layer has a different thermal expansion coefficient from a thermal expansion coefficient of the silicon layer and has a different rigidity coefficient from a rigidity coefficient of the silicon layer. The novel method includes at least the following steps.

An intermediate layer sandwiched between the silicon layer and the III-V group compound semiconductor layer is prepared to subsequently subject the intermediate, silicon and III-V group compound semiconductor layers to a heat treatment at a temperature not less than 450° C., provided that the intermediate layer comprises a thermal stress relaxation layer having a thermal expansion coefficient equal or near to the thermal expansion coefficient of the III-V group compound semiconductor layer and having a rigidity coefficient being sufficiently large to suppress generation of any crystal defects in the III-V group compound semiconductor layer due to a thermal stress generated in the heat treatment and subsequent cooling stage by the difference in the thermal expansion coefficient between the III-V group compound semiconductor layer and the silicon layer.

It is a still further preferable to form at least a semiconductor contact layer between the III-V group compound semiconductor layer and the thermal stress relaxation layer, provided that the semiconductor contact layer has a rigidity coefficient being sufficiently small for facilitating atomic re-arrangements in the contact layer by the heat treatment. The semiconductor contact layer may include at least any one of In and Sb.

It is yet a further preferable to form at least an insulation contact layer between the III-V group compound semiconductor layer and the thermal stress relaxation layer to permit a low temperature bonding with a static voltage application.

It is also preferable that the thermal stress relaxation layer is formed on the silicon layer and the III-V group compound semiconductor layer is formed on a supporting substrate made of the same compound semiconductors as the III-V group compound semiconductor layer for subsequent contact of the thermal stress relaxation layer with the III-V group compound semiconductor layer.

It is also preferable that the III-V group compound semiconductor layer is formed on a supporting substrate made of the same compound semiconductors as the III-V group compound semiconductor layer and then the thermal stress relaxation layer is formed on the III-V group compound semiconductor layer for subsequent contact of the thermal stress relaxation layer with the silicon layer.

The present invention also provides a method for bonding a III-V group compound semiconductor layer to a silicon layer wherein the III-V group compound semiconductor layer has a different thermal expansion coefficient from a thermal expansion coefficient of the silicon layer and has a different rigidity coefficient from a rigidity coefficient of the silicon layer. The method may include the following steps.

An intermediate layer sandwiched between the silicon layer and the III-V group compound semiconductor layer is prepared to subsequently subject the intermediate, silicon and III-V group compound semiconductor layers to a heat treatment at a temperature not less than 450° C., provided that the intermediate layer comprises a strained semiconductor layer capable of preventing a threading dislocation to extend through the strained layer into the III-V group compound semiconductor layer wherein the threading dislocation is caused by a thermal stress generated in the heat treatment and subsequent cooling stage due to the difference in the thermal expansion coefficient between the III-V group compound semiconductor layer and the silicon layer.

The present invention provides a method for bonding a III-V group compound semiconductor layer to a silicon layer wherein the III-V group compound semiconductor layer has a different thermal expansion coefficient from a thermal expansion coefficient of the silicon layer and has a different rigidity coefficient from a rigidity coefficient of the silicon layer. The method comprises the following steps. An intermediate layer sandwiched between the silicon layer and the III-V group compound semiconductor layer is formed to subject the intermediate, silicon and III-V group compound semiconductor layers to a heat treatment at a temperature not less than 450° C. The intermediate layer comprises an amorphous semiconductor layer capable of preventing a threading dislocation to extend through the strained layer into the III-V group compound semiconductor layer wherein the threading dislocation is caused by a thermal stress generated in the heat treatment and subsequent cooling stage due to the difference in the thermal expansion coefficient between the III-V group compound semiconductor layer and the silicon layer. The amorphous semiconductor layer comprises an amorphous semiconductor being kept in amorphous state even after the heat treatment was carried out.

The present invention provides a method for bonding a III-V group compound semiconductor layer to a silicon layer wherein the III-V group compound semiconductor layer has a different thermal expansion coefficient from a thermal expansion coefficient of the silicon layer and has a different rigidity coefficient from a rigidity coefficient of the silicon layer. The method comprises the following steps. An intermediate layer sandwiched between the silicon layer and the III-V group compound semiconductor layer is formed for subsequent subjecting the intermediate, silicon and III-V group compound semiconductor layers to a heat treatment at a temperature not less than 450° C., wherein the intermediate layer comprises an insulation layer in amorphous state, which is capable of presenting a threading dislocation to extend through the strained layer into the III-V group compound semiconductor layer, the threading dislocation being caused by a thermal stress generated in the heat treatment and subsequent cooling stage due to the difference in the thermal expansion coefficient between the III-V group compound semiconductor layer and the silicon layer, and the insulation layer comprising an insulation material being kept in amorphous state even after the heat treatment was carried out.

BRIEF DESCRIPTIONS OF THE DRAWINGS

Preferred embodiments of the present invention will be described in detail with reference to the accompanying drawings.

DESCRIPTIONS OF THE INVENTION

Figure 1A:
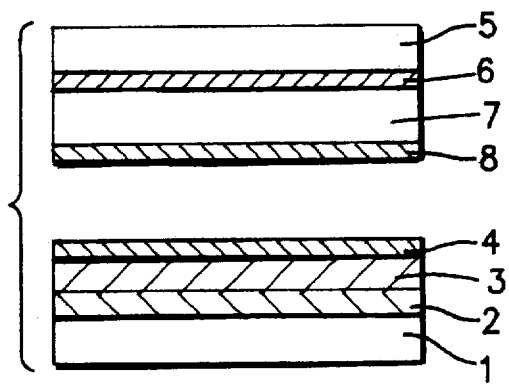
FIGS. 1A to 1C are fragmentary cross sectional elevation views illustrative of sequential steps involved in a method for bonding a III-V group compound semiconductor layer on a silicon layer in a first embodiment according to the present invention.

The present invention provides a novel method for bonding a III-V group compound semiconductor layer to a silicon layer. The III-V group compound semiconductor layer has a different thermal expansion coefficient from a thermal expansion coefficient of the silicon layer and has a different rigidity coefficient from a rigidity coefficient of the silicon layer. The novel method includes at least the following steps.

An intermediate layer sandwiched between the silicon layer and the III-V group compound semiconductor layer is prepared to subsequently subject the intermediate, silicon and III-V group compound semiconductor layers to a heat treatment at a temperature not less than 450° C., provided that the intermediate layer comprises a thermal stress relaxation layer having a thermal expansion coefficient equal or near to the thermal expansion coefficient of the III-V group compound semiconductor layer and having a rigidity coefficient being sufficiently large to suppress generation of any crystal defects in the III-V group compound semiconductor layer due to a thermal stress generated in the heat treatment and subsequent cooling stage by the difference in the thermal expansion coefficient between the III-V group compound semiconductor layer and the silicon layer.

More concretely, the thermal stress relaxation layer may comprise a semiconductor material including at least any one of Ge, Ga and Al. The thermal stress relaxation layer may include at least a Ge layer. The thermal stress relaxation layer may also include at least an SiGe amorphous layer. The thermal stress relaxation layer may also includes at least an Si/Ge superlattice layer. The thermal stress relaxation layer may also include at least an AlP layer. The thermal stress relaxation layer may also include at least a GaP layer. The thermal stress relaxation layer may also includes at least an AlAs layer. The thermal stress relaxation layer may also include at least a GaAs layer. The thermal stress relaxation layer may also include at least a layer of amorphous semiconductors including at least two compound semiconductors selected from the group consisting of AlP, GaP, AlAs and GaAs. The thermal stress relaxation layer may also include at least a superlattice layer of two kinds of compound semiconductor layers wherein the two compound semiconductors are selected from the group consisting of AlP, GaP, AlAs and GaAs.

It is further preferable to form a strained semiconductor layer between the intermediate layer and the III-V group compound semiconductor layer wherein the strained semiconductor layer is capable of preventing a threading dislocation to extend through the strained layer into the III-V group compound semiconductor layer. The threading dislocation is caused by a thermal stress generated in the heat treatment and subsequent cooling stage due to the difference in the thermal expansion coefficient between the III-V group compound semiconductor layer and the silicon layer. The strained semiconductor layer includes at least a semiconductor layer having a rigidity coefficient being sufficiently small to permit generation of crystal defects in the strained semiconductor layer by a thermal stress generated in the heat treatment and subsequent cooling stage due to the difference in the thermal expansion coefficient between the III-V group compound semiconductor layer and the silicon layer. The strained semiconductor layer may comprise a semiconductor material including at least any one of In and Sb. The strained semiconductor layer may also comprise a lamination of at least two semiconductor layers having different lattice constants from each other. The strained semiconductor layer may also comprise a lamination of at least two semiconductor layers having different planes from each other. The strained semiconductor layer may also comprise a lamination of at least two semiconductor layers having different crystal axes in tilted angle from each other. The strained semiconductor layer may also comprise a lamination of at least two semiconductor layers having different crystal axes in rotation direction from each other. The strained semiconductor layer may also comprise strained semiconductor super-lattice layers. The strained semiconductor super-lattice layers may also comprise InAlAs/InGaAs super-lattice layers.

It is furthermore preferable to form an amorphous semiconductor layer between the intermediate layer and the III-V group compound semiconductor layer wherein the amorphous semiconductor layer is capable of preventing a threading dislocation to extend through the strained layer into the III-V group compound semiconductor layer. The threading dislocation is caused by a thermal stress generated in the heat treatment and subsequent cooling stage due to the difference in the thermal expansion coefficient between the III-V group compound semiconductor layer and the silicon layer. It is required that the amorphous semiconductor layer comprises an amorphous semiconductor being kept in amorphous state even after the heat treatment was carried out.

It is moreover preferable to for an insulation layer in an amorphous state between the intermediate layer and the III-V group compound semiconductor layer wherein the insulation layer is capable of preventing a threading dislocation to extend through the strained layer into the III-V group compound semiconductor layer. The threading dislocation is caused by a thermal stress generated in the heat treatment and subsequent cooling stage due to the difference in the thermal expansion coefficient between the III-V group compound semiconductor layer and the silicon layer. The insulation layer comprises an insulation material being kept in amorphous state even after the heat treatment was carried out. The insulation layer may comprise a $SiO_2$ layer. The III-V group semiconductor layer may also include at least any one of In and Sb.

It is a still further preferable to form at least a semiconductor contact layer between the III-V group compound semiconductor layer and the thermal stress relaxation layer, provided that the semiconductor contact layer has a rigidity coefficient being sufficiently small for facilitating atomic re-arrangements in the contact layer by the heat treatment. The semiconductor contact layer may include at least any one of In and Sb.

It is yet a further preferable to form at least an insulation contact layer between the III-V group compound semiconductor layer and the thermal stress relaxation layer to permit a low temperature bonding with a static voltage application.

It is also preferable that the thermal stress relaxation layer is formed on the silicon layer and the III-V group compound semiconductor layer is formed on a supporting substrate made of the same compound semiconductors as the III-V group compound semiconductor layer for subsequent contact of the thermal stress relaxation layer with the III-V group compound semiconductor layer.

It is also preferable that the III-V group compound semiconductor layer is formed on a supporting substrate made of the same compound semiconductors as the III-V group compound semiconductor layer and then the thermal stress relaxation layer is formed on the III-V group compound semiconductor layer for subsequent contact of the thermal stress relaxation layer with the silicon layer.

The present invention also provides a method for bonding a III-V group compound semiconductor layer to a silicon layer wherein the III-V group compound semiconductor layer has a different thermal expansion coefficient from a thermal expansion coefficient of the silicon layer and has a different rigidity coefficient from a rigidity coefficient of the silicon layer. The method may include the following steps.

An intermediate layer sandwiched between the silicon layer and the III-V group compound semiconductor layer is prepared to subsequently subject the intermediate, silicon and III-V group compound semiconductor layers to a heat treatment at a temperature not less than 450° C., provided that the intermediate layer comprises a strained semiconductor layer capable of preventing a threading dislocation to extend through the strained layer into the III-V group compound semiconductor layer wherein the threading dislocation is caused by a thermal stress generated in the heat treatment and subsequent cooling stage due to the difference in the thermal expansion coefficient between the III-V group compound semiconductor layer and the silicon layer.

The strained semiconductor layer may include at least a semiconductor layer having a rigidity coefficient being sufficiently small to permit generation of crystal defects in the strained semiconductor layer by a thermal stress generated in the heat treatment and subsequent cooling stage due to the difference in the thermal expansion coefficient between the III-V group compound semiconductor layer and the silicon layer. The strained semiconductor layer may comprise a semiconductor material including at least any one of In and Sb. The strained semiconductor layer may also comprise a lamination of at least two semiconductor layers having different lattice constants from each other. The strained semiconductor layer may also comprise a lamination of at least two semiconductor layers having different planes from each other. The strained semiconductor layer may also comprise a lamination of at least two semiconductor layers having different crystal axes in tilted angle from each other. The strained semiconductor layer may also comprise a lamination of at least two semiconductor layers having different crystal axes in rotation direction from each other. The strained semiconductor layer may also comprise strained semiconductor super-lattice layers. The strained semiconductor super-lattice layers may also comprise InAlAs/InGaAs super-lattice layers.

It is preferable to form a thermal stress relaxation layer between the intermediate layer and the silicon layer. The thermal stress relaxation layer has a thermal expansion coefficient equal or near to the thermal expansion coefficient of the III-V group compound semiconductor layer and has a rigidity coefficient being sufficiently large to suppress generation of any crystal defects in the III-V group compound semiconductor layer due to a thermal stress generated in the heat treatment and subsequent cooling stage by the difference in the thermal expansion coefficient between the III-V group compound semiconductor layer and the silicon layer. The thermal stress relaxation layer may comprise a semiconductor material including at least any one of Ge, Ga and Al. The thermal stress relaxation layer may also include at least a Ge layer. The thermal stress relaxation layer may also include at least an SiGe amorphous layer. The thermal stress relaxation layer may also include at least an Si/Ge superlattice layer. The thermal stress relaxation layer may also include at least an AlP layer. The thermal stress relaxation layer may also include at least a GaP layer. The thermal stress relaxation layer may also include at least an AlAs layer. The thermal stress relaxation layer may also include at least a GaAs layer. The thermal stress relaxation layer may also include at least a layer of amorphous semiconductors including at least two compound semiconductors selected from the group consisting of AlP, GaP, AlAs and GaAs. The thermal stress relaxation layer may also include at least a superlattice layer of two kinds of compound semiconductor layers made of the two compound semiconductors being selected from the group consisting of AlP, GaP, AlAs and GaAs. The III-V group semiconductor layer may also include at least any one of In and Sb.

It is further preferable to form at least a semiconductor contact layer between the thermal stress relaxation layer and the strained semiconductor layer. The semiconductor contact layer has a rigidity coefficient being sufficiently small for facilitating atomic re-arrangements in the contact layer by the heat treatment. The semiconductor contact layer may include at least any one of In and Sb.

It is furthermore preferable to form at least an insulation contact layer between the thermal stress relaxation layer and the strained semiconductor layer to permit a low temperature bonding with a static voltage application.

It is moreover preferable that the III-V group compound semiconductor layer is formed on a supporting substrate made of the same compound semiconductors as the III-V group compound semiconductor layer and then the strained semiconductor layer is formed on the III-V group compound semiconductor layer, thereafter the thermal stress relaxation layer is formed on the strained semiconductor layer to contact the thermal stress relaxation layer with the silicon layer.

The present invention provides a method for bonding a III-V group compound semiconductor layer to a silicon layer wherein the III-V group compound semiconductor layer has a different thermal expansion coefficient from a thermal expansion coefficient of the silicon layer and has a different rigidity coefficient from a rigidity coefficient of the silicon layer. The method comprises the steps. An intermediate layer sandwiched between the silicon layer and the III-V group compound semiconductor layer is formed to subject the intermediate, silicon and III-V group compound semiconductor layers to a heat treatment at a temperature not less than 450° C. The intermediate layer comprises an amorphous semiconductor layer capable of preventing a threading dislocation to extend through the strained layer into the III-V group compound semiconductor layer wherein the threading dislocation is caused by a thermal stress generated in the heat treatment and subsequent cooling stage due to the difference in the thermal expansion coefficient between the III-V group compound semiconductor layer and the silicon layer. The amorphous semiconductor layer comprises an amorphous semiconductor being kept in amorphous state even after the heat treatment was carried out.

It is preferable that a thermal stress relaxation layer between the intermediate layer and the silicon layer is formed wherein the thermal stress relaxation layer has a thermal expansion coefficient equal or near to the thermal expansion coefficient of the III-V group compound semiconductor layer and has a rigidity coefficient being sufficiently large to suppress generation of any crystal defects in the III-V group compound semiconductor layer due to a thermal stress generated in the heat treatment and subsequent cooling stage by the difference in the thermal expansion coefficient between the III-V group compound semiconductor layer and the silicon layer. The thermal stress relaxation layer may comprise a semiconductor material including at least any one of Ge, Ga and Al. The thermal stress relaxation layer may also include at least a Ge layer. The thermal stress relaxation layer may also include at least an SiGe amorphous layer. The thermal stress relaxation layer may also include at least an Si/Ge superlattice layer. The thermal stress relaxation layer may also include at least an AlP layer. The thermal stress relaxation layer may also include at least a GaP layer. The thermal stress relaxation layer may also include at least an AlAs layer. The thermal stress relaxation layer may also include at least a GaAs layer. The thermal stress relaxation layer may also include at least a layer of amorphous semiconductors including at least two compound semiconductors selected from the group consisting of AlP, GaP, AlAs and GaAs. The thermal stress relaxation layer may also include at least a superlattice layer of two kinds of compound semiconductor layers, the two compound semiconductors being selected from the group consisting of AlP, GaP, AlAs and GaAs. The III-V group semiconductor layer may also include at least any one of In and Sb.

It is further preferable to form at least a semiconductor contact layer between the thermal stress relaxation layer and the amorphous semiconductor layer wherein the semiconductor contact layer has a rigidity coefficient being sufficiently small for facilitating atomic re-arrangements in the contact layer by the heat treatment. The semiconductor contact layer may also include at least any one of In and Sb.

It is furthermore preferable to form at least an insulation contact layer between the thermal stress relaxation layer and the amorphous semiconductor layer to permit a low temperature bonding with a static voltage application.

It is also preferable that the III-V group compound semiconductor layer is formed on a supporting substrate made of the same compound semiconductors as the III-V group compound semiconductor layer and then the amorphous semiconductor layer is formed on the III-V group compound semiconductor layer thereafter the thermal stress relaxation layer is formed on the silicon layer to contact the thermal stress relaxation layer with the amorphous semiconductor layer.

The present invention provides a method for bonding a III-V group compound semiconductor layer to a silicon layer wherein the III-V group compound semiconductor layer has a different thermal expansion coefficient from a thermal expansion coefficient of the silicon layer and has a different rigidity coefficient from a rigidity coefficient of the silicon layer. The method comprises the following steps. An intermediate layer sandwiched between the silicon layer and the III-V group compound semiconductor layer is formed for subsequent subjecting the intermediate, silicon and III-V group compound semiconductor layers to a heat treatment at a temperature not less than 450° C., wherein the intermediate layer comprises an insulation layer in amorphous state, which is capable of preventing a threading dislocation to extend through the strained layer into the III-V group compound semiconductor layer, the threading dislocation being caused by a thermal stress generated in the heat treatment and subsequent cooling stage due to the difference in the thermal expansion coefficient between the III-V group compound semiconductor layer and the silicon layer, and the insulation layer comprising an insulation material being kept in amorphous state even after the heat treatment was carried out.

It is further preferable to form a thermal stress relaxation layer between the intermediate layer and the silicon layer wherein the thermal stress relaxation layer has a thermal expansion coefficient equal or near to the thermal expansion coefficient of the III-V group compound semiconductor layer and has a rigidity coefficient being sufficiently large to suppress generation of any crystal defects in the III-V group compound semiconductor layer due to a thermal stress generated in the heat treatment and subsequent cooling stage by the difference in the thermal expansion coefficient between the III-V group compound semiconductor layer and the silicon layer. The thermal stress relaxation layer may also comprise a semiconductor material including at least any one of Ge, Ga and Al. The thermal stress relaxation layer may also include at least a Ge layer. The thermal stress relaxation layer may also include at least an SiGe amorphous layer. The thermal stress relaxation layer may also include at least an Si/Ge superlattice layer. The thermal stress relaxation layer may also include at least an AlP layer. The thermal stress relaxation layer may also include at least a GaP layer. The thermal stress relaxation layer may also include at least an AlAs layer. The thermal stress relaxation layer may also include at least a GaAs layer. The thermal stress relaxation layer may also include at least a layer of amorphous insulation including at least two compound semiconductors selected from the group consisting of AlP, GaP, AlAs and GaAs. The thermal stress relaxation layer may also include at least a superlattice layer of two kinds of compound semiconductor layers wherein the two compound semiconductors are selected from the group consisting of AlP, GaP, AlAs and GaAs. The III-V group semiconductor layer may also include at least any one of In and Sb.

It is moreover preferable to form at least a semiconductor contact layer between the thermal stress relaxation layer and the amorphous insulation layer wherein the semiconductor contact layer has a rigidity coefficient being sufficiently small for facilitating atomic re-arrangements in the contact layer by the heat treatment. The semiconductor contact layer may also include at least any one of In and Sb.

It is a still further preferable to form at least an insulation contact layer between the thermal stress relaxation layer and the amorphous insulation layer to permit a low temperature bonding with a static voltage application.

It is also preferable that the III-V group compound semiconductor layer is formed on a supporting substrate made of the same compound semiconductors as the III-V group compound semiconductor layer and then the amorphous insulation layer is formed on the III-V group compound semiconductor layer and thereafter the thermal stress relaxation layer is formed on the silicon layer for subsequent contacting the thermal stress relaxation layer with the amorphous insulation layer. The amorphous insulation layer may comprise a $SiO_2$ layer.

The above present inventions were made by drawing the attentions in the following matters. The III-V group compound semiconductor layer has a different thermal expansion coefficient from that of the silicon. The direct bonding between the III-V group uses a heat treatment and subsequent cooling which may cause a thermal stress generating crystal defects such as threading dislocations. To prevent any generation of crystal defects such as threading dislocations, an intermediate layer having a high rigidity coefficient but having a thermal expansion equal to or near to that of the III-V group compound semiconductor layer is provided between the silicon substrate and the III-V group compound semiconductor layer so that the high rigidity coefficient of the intermediate layer is able to suppress any generation of crystal defects, particularly threading dislocation in the intermediate layer due to a thermal stress due to the difference in a thermal expansion coefficient between the intermediate layer and the silicon substrate. By contrast, only a small thermal stress is generated between the intermediate layer and the III-V group compound semiconductor layer because the both layers have a small difference in thermal expansion coefficient as described above. For that reason, even the III-V group compound semiconductor layer has a small rigidity coefficient, almost no crystal defect nor threading dislocation is introduced into the III-V group compound semiconductor layer. It is noted that only the III-V group compound semiconductor layer serves as a device layer which provide a serious influence to a semiconductor device performance. Accordingly, it is required to prevent any generation of the crystal defect in the III-V group compound semiconductor layer serving as a device layer, but not necessarily required to prevent generation of the crystal defects in the silicon substrate and the intermediate layer. However, since silicon has a large rigidity coefficient, the silicon substrate tends to be free from generation of the crystal defects, particularly the threading dislocation. The above intermediate layer having a sufficiently large rigidity coefficient for preventing any generation of crystal defects such as dislocations in the III-V group compound semiconductor layer during the heat treatment not less than 440° C. and subsequent cooling stage. From the above descriptions, the intermediate layer may be regarded as a layer for providing a relaxation of the thermal stress or as acting as a thermal stress relaxation layer.

The following TABLE 1 shows rigidity coefficients and thermal expansion coefficients for typical VI group and III-V group semiconductors usable for various semiconductor electronic or optoelectronic devices.

TABLE 1

| Semiconductors | Rigidity Coefficients ($10^{11}$ dyb cm$^{-2}$) | Thermal expansions (deg$^{-1}$) |
|---|---|---|
| Si (VI group) | 5.09 | 2.6 |
| Ge (VI group) | 4.14 | 5.9 |
| GaP (III-V group) | 3.93 | 4.7 |
| AlP (III-V group) | 3.85 | 4.2 |
| GaAs (III-V group) | 3.25 | 5.8 |
| AlAs (III-V group) | 3.16 | 5.2 |
| InP (III-V group) | 2.23 | 4.6 |
| InAs (III-V group) | 1.90 | 5.2 |
| GaSb (III-V group) | 2.41 | 6.4 |
| AlSb (III-V group) | 2.26 | 4.3 |
| InSb (III-V group) | 1.64 | 5.1 |

From the above, Si and Ge have large rigidity coefficients but Si has a small thermal expansion coefficient as compared to the other semiconductors. All the above semiconductors except for Si have relatively similar thermal expansion coefficients, but have a large difference from Si. It may be considered that GaP, AlP, GaAs, AlAs have relatively large rigidity coefficients, while InP, InAs, GaSb, AlSb and InSb have relatively small rigidity coefficients. In summary, it may be considered that V-group semiconductors and III-V group compound semiconductors which do not include In and Sb have relatively large rigidity coefficients, for which reason these semiconductors except for Si, In and Sb are available as semiconductor materials for the intermediate layer or the thermal stress relaxation layer. Notwithstanding, even if the intermediate layer or the thermal stress relaxation layer includes a small amount of In and Sb, the intermediate layer is available which mainly includes the large rigidity compound semiconductors to have a large rigidity of the layer. It is preferable that the intermediate layer or the thermal stress relaxation layer has a thickness at least 1 micrometers or more.

Prior to the heat treatment, the intermediate layer or the thermal stress relaxation layer is formed by heteroepitaxial growth either on the silicon substrate or on the III-V group compound semiconductor layer. It is available to form a contact layer made of an insulation material or a semiconductor having a small rigidity coefficient on a contact surface of the thermal stress relaxation layer. When use of the insulation contact layer such as a $SiO_2$ layer, then the bonding may be obtained at a relatively low temperature heat treatment but together with an application of a high voltage to the bonding interface. When use of the semiconductor contact layer such as an InP layer having a small rigidity coefficient, then the bonding is completed by the heat treatment at a relatively low temperature as compared in no use of the contact layer.

The III-V group compound semiconductor layer acting as a device layer may be formed on a supporting layer lattice matched or mismatched to the III-V group compound semiconductor layer, or may be formed on an insulation supporting layer, provided that it is possible to grow the III-V group compound semiconductor layer being free from any appearance of crystal imperfections of crystal defects such as dislocations caused by the thermal stress and the lattice mismatch.

Moreover, a single or plural strained semiconductor layers or strained semiconductor super-lattice layers are available as the intermediate layer to be sandwiched between the III-V group compound semiconductor layer and the silicon layer, both of which have largely different thermal expansion coefficients. The strained semiconductor layer is able to relax and absorb the thermal stress thereby preventing the threading dislocation to extend across the strained layer as well as able to bend the direction of the threading dislocation into the parallel direction to the interface of the strained layer to thereby prevent the threading dislocation to extend across the interface of the strained layer. The strained layer sandwiched between the silicon substrate and the III-V group compound semiconductor layer is able to prevent the threading dislocation to extend through the strained layer into the III-V group compound semiconductor layer.

It is more preferable to use the strained semiconductor layer together with the thermal stress relaxation layer having the large rigidity coefficient. It is possible to form the thermal stress relaxation layer in the silicon substrate side while the strained semiconductor layer in the III-V group compound semiconductor layer so that even if a threading dislocation appears due to the thermal stress and then extends toward the III-V group compound semiconductor layer, then the strained semiconductor layer provided between the III-V group compound semiconductor layer and the thermal stress relaxation layer having a large rigidity coefficient is able to ensure that no threading dislocation may extend through the strained layer into the III-V group compound semiconductor layer.

Furthermore, an amorphous insulation or semiconductor layer is also available as the intermediate layer to be sandwiched between the III-V group compound semiconductor layer and the silicon layer. The amorphous semiconductor or amorphous insulation layer has none of the crystal structure in which the dislocation may be in the presence. Accordingly, no dislocation nor crystal defects is absolutely present in the amorphous layer. A $SiO_2$ layer is a typical amorphous insulation layer. When use of the amorphous semiconductor layer, the semiconductor material for the amorphous layer is required to be so selected that the selected semiconductor may be kept in the amorphous state even after a high temperature heat treatment for the bonding. For those reasons, the amorphous layer is able to ensure none of any threading dislocation to extend into the amorphous layer and namely able to prevent the threading dislocation to extend through the amorphous layer into the III-V group compound semiconductor layer.

It is more preferable to use the amorphous semiconductor layer together with the thermal stress relaxation layer having the large rigidity coefficient. It is possible to form the thermal stress relaxation layer in the silicon substrate side while the amorphous layer in the III-V group compound semiconductor layer so that even if a threading dislocation appears and then extends toward the III-V group compound semiconductor layer, the amorphous layer is able to ensure that no threading dislocation may extend through the strained layer into the III-V group compound semiconductor layer.

PREFERRED EMBODIMENTS

Whereas the detailed descriptions of the subject matters of the present invention were made, some typical preferred embodiments of the present invention will hereinafter fully be described with reference to the accompanying drawings.

A first embodiment according to the present invention provides a novel bonding method for bonding a III-V group compound semiconductor layer on a silicon substrate. As illustrated in FIG. 1A, a thermal cleaning at a temperature of 1000° C. of a silicon substrate is carried out to obtain a single domain Si(100) substrate 1 on which a GaP thermal stress relaxation layer 2 having a thickness of 0.5 micrometers is subsequently grown. A GaAs thermal stress relaxation layer 3 having a thickness of 1 micrometer is grown on the GaAs thermal stress relaxation layer 2. A first InP contact layer 4 having a thickness of 0.3 micrometers is grown on the GaAs thermal stress relaxation layer 3. Further, an InGaAs spacer layer 6 having a thickness of 0.3 micrometers is grown on an InP (100) substrate 5. A III-V compound semiconductor layer 7 of acting as a device layer having a thickness of 2 micrometers is grown on the InGaAs spacer layer 6. A second InP contact layer 8 having a thickness of 0.3 micrometers is grown on the InP device layer 7. The above growths for the respective layers are carried out by use of gas source molecular beam epitaxy using $AsH_3$ and $PH_3$ as V-group sources.

Figure 1B:
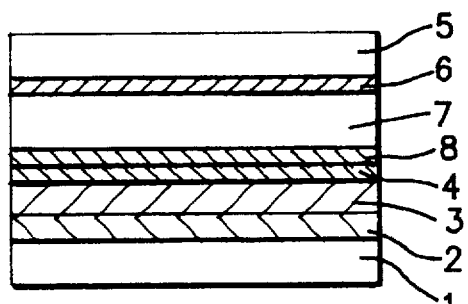

As illustrated in FIG. 1B, upon use of a liquid including sulfuric acid, a surface treatment of the first and second contact layers 4 and 8 for subsequent contacting the InP (100) substrate 5 with the silicon substrate 1 through the first and second contact layers 4 and 8. A bonding interface is defined by the interface of the first and second contact layers 4 and 8. The InP (100) substrate 5 is pressed toward the Si(100) substrate 1 by use of a relatively light mass, during which the both substrates 1 and 5 are subjected to a heat treatment in hydrogen at a temperature of 600° C. for 30 minutes thereby the secure bonding is obtained.

Figure 1C:
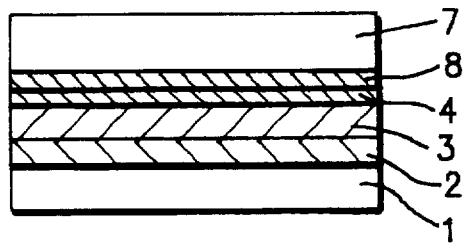

As illustrated in FIG. 1C, a polishing and a selective etching are carried out to remove the InP(100) substrate 5 and the InGaAs spacer layer 6 until a surface of the InP device layer 7 is exposed.

The crystal quality of the obtained InP device layer 7 was measured by photo-luminescence and it was confirmed that a sufficient intensity of photoluminescence of the InP device layer is obtained and also confirmed that a small mount of the shift of the photoluminescence is obtained wherein the amount of the shift of the photoluminescence corresponds to a thermal stress due to the difference in thermal expansion of the layers. It was also confirmed that the InP device layer has a good flatness. upon measurements and transmission electron microscope for etch pit density, it was further confirmed that a dislocation density is suppressed in the range of from $10^5$ to $10^6$ and thus the InP device layer has a good quality of crystal.

As a comparative example, an InP contact layer having a thickness of 0.3 micrometers is grown directly on a Si(100) substrate. An InP device layer is grown directly on an InP(100) substrate. Thereafter, the Si(100) substrate and the InP(100) substrate are laminated through the InP device layer and the InP contact layer for subsequent heat treatment for bonding of the substrate. An extremely large number of of cross-hatch appeared on a surface of the InP device layer and a high density of dislocations was in the order of $10^7$ cm$^{-2}$. Remarkable threading dislocations were generated in the InP device layer.

Figure 2A:
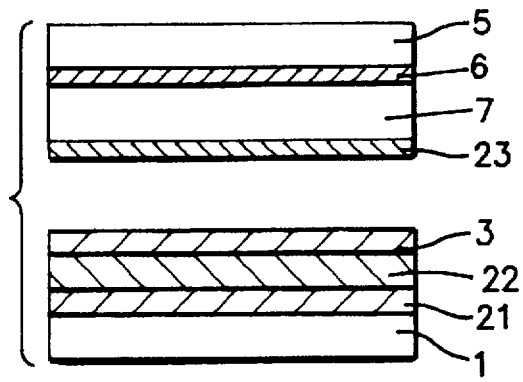
FIGS. 2A and 2B are fragmentary cross sectional elevation views illustrative of sequential steps involved in a method for bonding a III-V group compound semiconductor layer on a silicon layer in a second embodiment according to the present invention.

A second embodiment according to the present invention provides another novel bonding method for bonding a III-V group compound semiconductor layer on a silicon substrate. As illustrated in FIG. 2A, a Si/Ge super-lattice thermal stress relaxation layer 21 having a total thickness of 0.6 micrometers is formed on a Si(100) substrate 1 wherein the Si/Ge super-lattice thermal stress relaxation layer 21 comprises three periods of Si layers having a thickness of 100 nanometers and Ge layers having a thickness of 100 nanometers. A Ge thermal stress relaxation layer 22 having a thickness of 1 micrometer is subsequently grown on the Si/Ge super-lattice thermal stress relaxation layer 21. A GaAS thermal stress relaxation layer 3 having a thickness of 0.5 micrometers is grown on the Ge thermal stress relaxation layer 22. Further, an InGaAs spacer layer 6 having a thickness of 0.3 micrometers is grown on an InP (100) substrate 5. A III-V compound semiconductor layer 7 of InP acting as a device layer having a thickness of 2 micrometers is grown on the InGaAs spacer layer 6. An InP contact layer 8 having a thickness of 0.3 micrometers is grown on the InP device layer 7. The above growths for the respective layers are carried out by use of gas source molecular beam epitaxy using AsH$_3$ and PH$_3$ as V-group sources as well as Si$_2$H$_6$ and GeH$_4$ as V-group source.

Figure 2B:
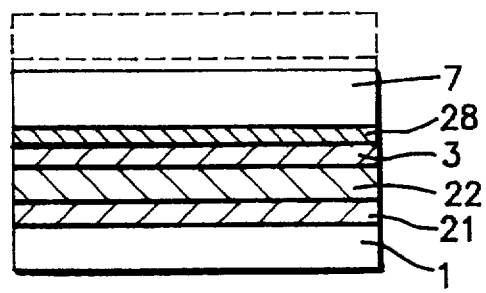

As illustrated in FIG. 2B, upon use of a liquid including sulfuric acid, a surface treatment of the GaAs thermal stress relaxation layer 3 and the InP contact layers 23 for subsequent contacting the InP (100) substrate 5 with the silicon substrate 1 through the GaAs thermal stress relaxation layer 3 and the InP contact layers 23. The InP (100) substrate 5 is pressed toward the Si(100) substrate 1 by use of a relatively light mass, during which the both substrates 1 and 5 are subjected to a heat treatment in hydrogen at a temperature of 700° C. for 30 minutes thereby the secure bonding is obtained.

A polishing and a selective etching are carried out to remove the InP(100) substrate 5 and the InGaAs spacer layer 6 until a surface of the InP device layer 7 is exposed.

The crystal quality of the obtained InP device layer 7 was measured by photo-luminescence and it was confirmed that a sufficient intensity of photoluminescence of the InP device layer is obtained and also confirmed that a small mount of the shift of the photoluminescence is obtained wherein the amount of the shift of the photoluminescence corresponds to a thermal stress due to the difference in thermal expansion of the layers. It was also confirmed that the InP device layer has a good flatness. upon measurements and transmission electron microscope for etch pit density, it was further confirmed that a dislocation density is suppressed not more than $10^4$ cm$^{-2}$ and thus the InP device layer has a good quality of crystal.

Figure 3A:
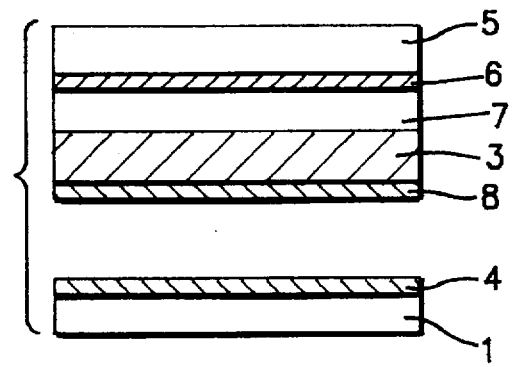
FIGS. 3A and 3B are fragmentary cross sectional elevation views illustrative of sequential steps involved in a method for bonding a III-V group compound semiconductor layer on a silicon layer in a third embodiment according to the present invention.

A third embodiment according to the present invention provides another novel bonding method for bonding a III-V group compound semiconductor layer on a silicon substrate. As illustrated in FIG. 3A, a first InP contact layer 4 having a thickness of 0.3 micrometers is grown on a single domain Si(100) substrate 1. Further, an InGaAS spacer layer 6 having a thickness of 0.3 micrometers is grown on an InP (100) substrate 5. A III-V compound semiconductor layer 7 of InP acting as a device layer having a thickness of 2 micrometers is grown on the InGaAs spacer layer 6. A GaAs thermal stress relaxation layer 3 having a thickness of 1.5 micrometers is subsequently grown on the InP device layer 7. A second InP contact layer 8 having a thickness of 0.3 micrometers is grown on the GaAs thermal stress relaxation layer 3. The above growths for the respective layers are carried out by use of gas source molecular beam epitaxy.

Figure 3B:
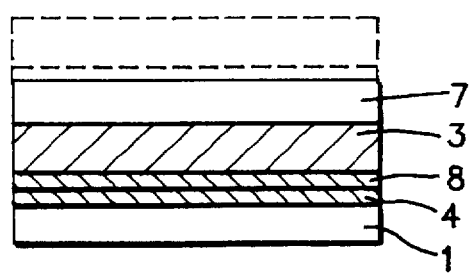

As illustrated in FIG. 3B, upon use of a liquid including sulfuric acid, a surface treatment of the first and second contact layers 4 and 8 for subsequent contacting the InP (100) substrate 5 with the silicon substrate 1 through the first and second contact layers 4 and 8. A bonding interface is defined by the interface of the first and second contact layers 4 and 8. The InP (100) substrate 5 is pressed toward the Si(100) substrate 1 by use of a relatively light mass, during which the both substrates 1 and 5 are subjected to a heat treatment in hydrogen at a temperature of 600° C. for 30 minutes thereby the secure bonding is obtained.

A polishing and a selective etching are carried out to remove the InP(100) substrate 5 and the InGaAs spacer layer 6 until a surface of the InP device layer 7 is exposed.

The crystal quality of the obtained InP device layer 7 was measured by photo-luminescence and it was confirmed that a sufficient intensity of photoluminescence of the InP device layer is obtained and also confirmed that a small mount of the shift of the photoluminescence is obtained wherein the amount of the shift of the photoluminescence corresponds to a thermal stress due to the difference in thermal expansion of the layers. It was also confirmed that the InP device layer has a good flatness. upon measurements and transmission electron microscope for etch pit density, it was further confirmed that a dislocation density is suppressed in the low range and thus the InP device layer has a good quality of crystal.

Figure 4A:
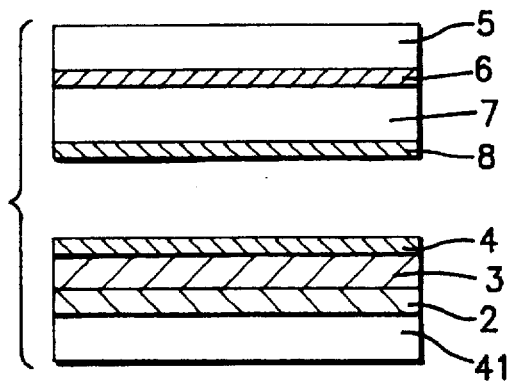
FIGS. 4A to 4C are fragmentary cross sectional elevation views illustrative of sequential steps involved in a method for bonding a III-V group compound semiconductor layer on a silicon layer in a fourth embodiment according to the present invention.

A fourth embodiment according to the present invention provides a novel bonding method for bonding a III-V group compound semiconductor layer on a silicon substrate. As illustrated in FIG. 4A, a GaP thermal stress relaxation layer 2 having a thickness of 0.5 micrometers is grown on a Si(100)2°off substrate 41. A GaAs thermal stress relaxation layer 3 having a thickness of 1 micrometer is grown on the GaAs thermal stress relaxation layer 2. A first InP contact layer 4 having a thickness of 0.3 micrometers is grown on the GaAs thermal stress relaxation layer 3. Further, an InGaAs spacer layer 6 having a thickness of 0.3 micrometers is grown on an InP (100) substrate 5. A III-V compound semiconductor layer 7 of InP acting as a device layer having a thickness of 2 micrometers is grown on the InGaAs spacer layer 6. A second InP contact layer 8 having a thickness of 0.3 micrometers is grown on the InP device layer 7. The above growths for the respective layers are carried out by use of gas source molecular beam epitaxy.

Figure 4B:
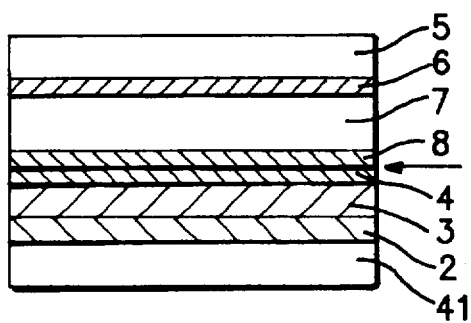

As illustrated in FIG. 4B, upon use of a liquid including sulfuric acid, a surface treatment of the first and second contact layers 4 and 8 for subsequent contacting the InP (100) substrate 5 with the Si(100)2°off substrate 41 through the first and second contact layers 4 and 8. A bonding interface is defined by the interface of the first and second contact layers 4 and 8. The InP (100) substrate 5 is pressed toward the Si(100)2°off substrate 41 by use of a relatively light mass, during which the both substrates 41 and 5 are subjected to a heat treatment in hydrogen at a temperature of 600° C. for 30 minutes thereby the secure bonding is obtained.

Figure 4C:
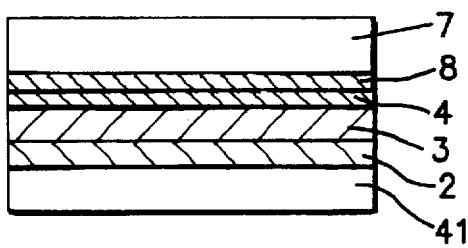

As illustrated in FIG. 4C, a polishing and a selective etching are carried out to remove the InP(100) substrate 5 and the InGaAs spacer layer 6 until a surface of the InP device layer 7 is exposed.

The crystal quality of the obtained InP device layer 7 was measured by photo-luminescence and it was confirmed that a sufficient intensity of photoluminescence of the InP device layer is obtained and also confirmed that a small mount of the shift of the photoluminescence is obtained wherein the amount of the shift of the photoluminescence corresponds to a thermal stress due to the difference in thermal expansion of the layers. It was also confirmed that the InP device layer has a good flatness. upon measurements and transmission electron microscope for etch pit density, it was further confirmed that a dislocation density is suppressed not less than $10^4$ cm$^{-2}$ and thus the InP device layer has a good quality of crystal. Upon the transmission electron microscope observation, the bonding interface is (100)2°off/just tilted bonding into which a large number of dislocations which may relax the lattice mismatch due to the (100)2°off/just tilted bonding interface. The (100)2°off/just tilted bonding interface may prevent high density crystal defect in the InP contact layer 4 to extend into the second contact layer 8 through the bonding interface including the large number of the crystal defects or may bend the direction of the threading dislocation from the first contact layer 4 toward a direction along the bonding interface.

The tilted angle may be varied. It is also available to rotate the crystal axes along the bonding interface. A Si(111) substrate may also be used. The lattice mismatched bonding interfaces are also available.

Figure 5A:
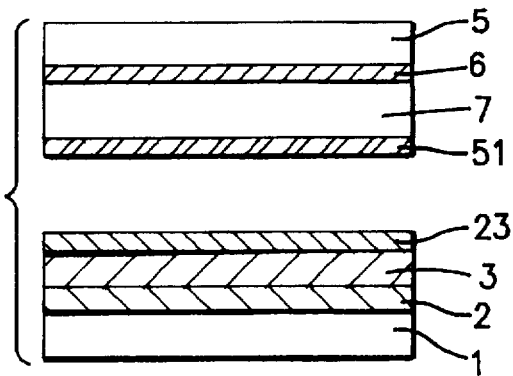
FIGS. 5A and 5B are fragmentary cross sectional elevation views illustrative of sequential steps involved in a method for bonding a III-V group compound semiconductor layer on a silicon layer in a fifth embodiment according to the present invention.

A fifth embodiment according to the present invention provides a novel bonding method for bonding a III-V group compound semiconductor layer on a silicon substrate. As illustrated in FIG. 5A, a GaP thermal stress relaxation layer 2 having a thickness of 0.5 micrometers is grown on a Si(100) substrate 1. A GaAs thermal stress relaxation layer 3 having a thickness of 1 micrometer is grown on the GaAs thermal stress relaxation layer 2. An InP contact layer 23 having a thickness of 0.3 micrometers is grown on the GaAs thermal stress relaxation layer 3. Further, an InGaAs spacer layer 6 having a thickness of 0.3 micrometers is grown on an InP (100) substrate 5. A III-V compound semiconductor layer 7 of InP acting as a device layer having a thickness of 2 micrometers is grown on the InGaAs spacer layer 6. A $SiO_2$ amorphous layer 51 acting as a dislocation block layer having a thickness of 50 nanometers is grown on the InP device layer 7. The above growths for the respective layers are carried out by use of gas source molecular beam epitaxy.

Figure 5B:
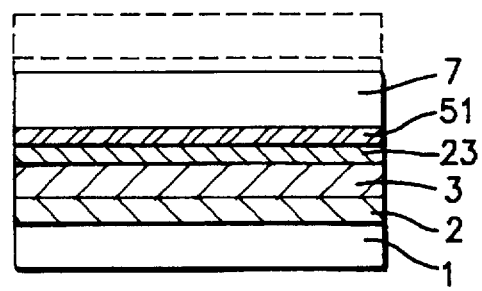

As illustrated in FIG. 5B, upon use of a liquid including sulfuric acid, a surface treatment of the $SiO_2$ dislocation block layer 51 and the InP contact layer 23 for subsequent contacting the InP (100) substrate 5 with the silicon substrate 1 through the $SiO_2$ dislocation block layer 51 and the InP contact layer 23. A bonding interface is defined by the interface of the $SiO_2$ dislocation block layer 51 and the InP contact layer 23. The InP (100) substrate 5 is pressed toward the Si(100) substrate 1 by use of a relatively light mass, during which the both substrates 1 and 5 are subjected to a heat treatment in hydrogen at a temperature of 700° C. for 30 minutes thereby the secure bonding is obtained.

A polishing and a selective etching are carried out to remove the InP(100) substrate 5 and the InGaAs spacer layer 6 until a surface of the InP device layer 7 is exposed.

The crystal quality of the obtained InP device layer 7 was measured by photo-luminescence and it was confirmed that a sufficient intensity of photoluminescence of the InP device layer is obtained and also confirmed that a small mount of the shift of the photoluminescence is obtained wherein the amount of the shift of the photoluminescence corresponds to a thermal stress due to the difference in thermal expansion of the layers. It was also confirmed that the InP device layer has a good flatness. Upon measurements and transmission electron microscope for etch pit density, it was further confirmed that a dislocation density is suppressed not more than $10^4$ cm$^{-2}$ and thus the InP device layer has a good quality of crystal.

Figure 6A:
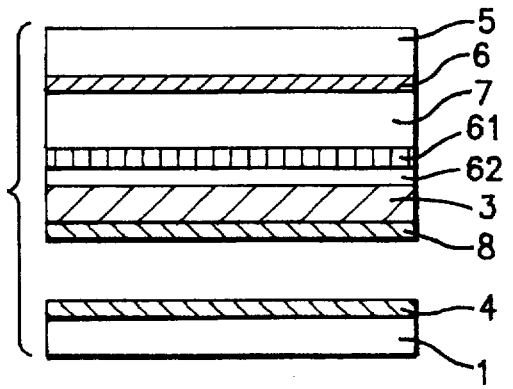
FIGS. 6A and 6B are fragmentary cross sectional elevation views illustrative of sequential steps involved in a method for bonding a III-V group compound semiconductor layer on a silicon layer in a sixth embodiment according to the present invention.

A sixth embodiment according to the present invention provides another novel bonding method for bonding a III-V group compound semiconductor layer on a silicon substrate. As illustrated in FIG. 6A, a first InP contact layer 4 having a thickness of 0.3 micrometers is grown on a single domain Si(100) substrate 1. Further, an InGaAs spacer layer 6 having a thickness of 0.3 micrometers is grown on an InP (100) substrate 5. A III-V compound semiconductor layer 7 of InP acting as a device layer having a thickness of 2 micrometers is grown on the InGaAs spacer layer 6. An InAlAs/InGaAs strained super-lattice dislocation block layer 61 is grown on the InP device layer 7 wherein the InAlAs/InGaAs strained super-lattice dislocation block layer 61 comprises ten periods of $In_{0.4}Al_{0.8}As$ layers having a thickness of 20 nanometers and $In_{0.53}Ga_{0.47}As$ layers having a thickness of 10 nanometers. In InP layer 62 is grown on the InAlAs/InGaAs strained super-lattice dislocation block layer 61. A GaAs thermal stress relaxation layer 3 having a thickness of 1.5 micrometers is subsequently grown on the InP layer 62. A second InP contact layer 8 having a thickness of 0.3 micrometers is grown on the GaAs thermal stress relaxation layer 3. The above growths for the respective layers are carried out by use of gas source molecular beam epitaxy.

Figure 6B:
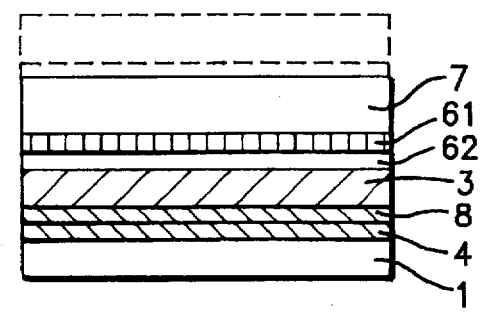

As illustrated in FIG. 6B, upon use of a liquid including sulfuric acid, a surface treatment of the first and second contact layers 4 and 8 for subsequent contacting the InP (100) substrate 5 with the silicon substrate 1 through the first and second contact layers 4 and 8. A bonding interface is defined by the interface of the first and second contact layers 4 and 8. The InP (100) substrate 5 is pressed toward the Si(100) substrate 1 by use of a relatively light mass, during which the both substrates 1 and 5 are subjected to a heat treatment in hydrogen at a temperature of 600° C. for 30 minutes thereby the secure bonding is obtained.

A polishing and a selective etching are carried out to remove the InP(100) substrate 5 and the InGaAs spacer layer 6 until a surface of the InP device layer 7 is exposed.

The crystal quality of the obtained InP device layer 7 was measured by photo-luminescence and it was confirmed that a sufficient intensity of photoluminescence of the InP device layer is obtained and also confirmed that a small mount of the shift of the photoluminescence is obtained wherein the amount of the shift of the photoluminescence corresponds to a thermal stress due to the difference in thermal expansion of the layers. It was also confirmed that the InP device layer has a good flatness. Upon measurements and transmission electron microscope for etch pit density, it was further confirmed that a dislocation density is suppressed in the low range and thus the InP device layer has a good quality of crystal.

As modifications of the sixth embodiment, InAsP/InP super-lattice layers or InGaP/InP super-lattice layers are available as a dislocation block layer in place of the above InAlAs/InGaAs strained super-lattice layers 61. A single strained layer of InGaAs or Si is also available. A graded composition layer in which the composition is graded from InP to GaAs is further available. It is available to form the GaAs thermal stress relaxation layer in the side of the Si substrate, wherein it is also available to omit the second contact layer 8 so that a surface of the InAlAs/InGaAs strained super-lattice layers 61 may serves as a bonding interface.

As further modifications of the third and sixth embodiments, the GaAs thermal stress relaxation layer is provided in the side of the InP substrate, at least any one of the contact layers defining the bonding interface may be an insulation layer such as $SiO_2$ layer. The insulation contact layer may provide an advantage in a low temperature heat treatment together with application of a high voltage. It is also permitted to omit to form the first contact layer so that the second contact layer is in contact directly with the Si substrate.

As modification of the first, second and sixth embodiments, when the GaAs thermal stress relaxation layer is provided in the side of the Si substrate, then it is permitted to use an insulation contact layer having a sufficiently small thickness for ignoring the difference in the thermal expansion coefficient. In this case, the insulation contact layer such as $SiO_2$ layer may act as a dislocation block layer as described in the fifth embodiment.

As modifications of all of the foregoing embodiments, in place the gas source molecular beam epitaxy, a metal organic chemical vapor deposition or a halogen transferring method are also available. The supporting substrate for the III-V group compound semiconductor device layer may be one lattice matched or mismatched to the device layer, provided that it is required to prevent any deterioration of the crystal quality of the device layer after grown.

Although the InP contact layer is most preferable because at a low temperature mass movement is caused due to migrations, other materials are also available as the contact layer.

Whereas any other modifications of the present invention will no doubt be apparent to a person having ordinary skill in the art to which the invention pertains, it is it is to be understood that embodiments shown and described by way of illustrations are by no means intended to be considered in a limiting sense, Accordingly it is to be intended to cover by claims all modifications of the invention which fall within the spirit and scope of the invention.

What is claimed is:

1. A method for bonding a III-V group compound semiconductor layer to a silicon layer, said III-V group compound semiconductor layer having a different thermal expansion coefficient from a thermal expansion coefficient of said silicon layer and having a different rigidity coefficient from a rigidity coefficient of said silicon layer, said method comprising the steps of:

preparing an intermediate layer sandwiched between said silicon layer and said III-V group compound semiconductor layer; and subjecting said intermediate, silicon and III-V group compound semiconductor layers to a heat treatment at a temperature not less than 450° C.;

wherein said intermediate layer comprises a thermal stress relaxation layer having a thermal expansion coefficient equal or near to the thermal expansion coefficient of said III-V group compound semiconductor layer and having a rigidity coefficient substantially greater than a rigidity coefficient of said III-V group compound semiconductor layer, thereby to suppress generation of any crystal defects in said III-V group compound semiconductor layer due to a thermal stress generated in said heat treatment and subsequent cooling stage by the difference in the thermal expansion coefficient between said III-V group compound semiconductor layer and said silicon layer.

2. The method as claimed in claim 1, wherein said thermal stress relaxation layer comprises a semiconductor material including at least any one of Ge, Ga and Al.

3. The method as claimed in claim 2, wherein said thermal stress relaxation layer includes at least a Ge layer.

4. The method as claimed in claim 2, wherein said thermal stress relaxation layer includes at least an SiGe amorphous layer.

5. The method as claimed in claim 2, wherein said thermal stress relaxation layer includes at least an Si/Ge superlattice layer.

6. The method as claimed in claim 2, wherein said thermal stress relaxation layer includes at least an AlP layer.

7. The method as claimed in claim 2, wherein said thermal stress relaxation layer includes at least a GaP layer.

8. The method as claimed in claim 2, wherein said thermal stress relaxation layer includes at least an AlAs layer.

9. The method are claimed in claim 2, wherein said thermal stress relaxation layer includes at least a GaAs layer.

10. The method as claimed in claim 2, wherein said thermal stress relaxation layer includes at least a layer of amorphous semiconductors including at least two compound semiconductors selected from the group consisting of AlP, GaP, AlAs and GaAs.

11. The method as claimed in claim 2, wherein said thermal stress relaxation layer includes at least a superlattice layer of two kinds of compound semiconductor layers, said two compound semiconductors being selected from the group consisting of AlP, GaP, AlAS and GaAs.

12. The method as claimed in claim 1, wherein said first preparation step further includes the step of forming a strained semiconductor layer between said intermediate layer and said III-V group compound semiconductor layer, said strained semiconductor layer being capable of preventing a threading dislocation extending through said strained layer into said III-V group compound semiconductor layer, said threading dislocation being caused by a thermal stress generated in said heat treatment and subsequent cooling stage due to the difference in the thermal expansion coefficient between said III-V group compound semiconductor layer and said silicon layer.

13. The method as claimed in claim 12, wherein said strained semiconductor layer includes at least a semiconductor layer having a rigidity coefficient being sufficiently small to permit generation of crystal defects in said strained semiconductor layer by a thermal stress generated in said heat treatment and subsequent cooling stage due to the difference in the thermal expansion coefficient between said III-V group compound semiconductor layer and said silicon layer.

14. The method as claimed in claim 13, wherein said strained semiconductor layer comprises a semiconductor material including at least any one of In and Sb.

15. The method as claimed in claim 12, wherein said strained semiconductor layer comprises a lamination of at least two semiconductor layers having different lattice constants from each other.

16. The method as claimed in claim 12, wherein said strained semiconductor layer comprises a lamination of at least two semiconductor layers having different planes from each other.

17. The method as claimed in claim 12, wherein said strained semiconductor layer comprises a lamination of at least two semiconductor layers having different crystal axes in tilted angle from each other.

18. The method as claimed in claim 12, wherein said strained semiconductor layer comprises a lamination of at least two semiconductor layers having different crystal axes in rotation direction from each other.

19. The method as claimed in claim 12, wherein said strained semiconductor layer comprises strained semiconductor super-lattice layers.

20. The method as claimed in claim 19, wherein said strained semiconductor super-lattice layers comprises InAlAs/InGaAs super-lattice layers.

21. The method as claimed in claim 1, wherein said first preparation step further includes the step of forming an amorphous semiconductor layer between said intermediate layer and said III-V group compound semiconductor layer, said amorphous semiconductor layer being capable of preventing a threading dislocation to extend through said strained layer into said III-V group compound semiconductor layer, said threading dislocation being caused by a thermal stress generated in said heat treatment and subsequent cooling stage due to the difference in the thermal expansion coefficient between said III-V group compound semiconductor layer and said silicon layer, and said amorphous semiconductor layer comprising an amorphous semiconductor being kept in amorphous state even after said heat treatment was carried out.

22. The method as claimed in claim 1, wherein said first preparation step further includes the step of forming an insulation layer in amorphous between said intermediate layer and said III-V group compound semiconductor layer, said insulation layer being capable of preventing a threading dislocation to extend through said strained layer into said III-V group compound semiconductor layer, said threading dislocation being caused by a thermal stress generated in said heat treatment and subsequent cooling stage due to the difference in the thermal expansion coefficient between said III-V group compound semiconductor layer and said silicon layer, and said insulation layer comprising an insulation material being kept in amorphous state even after said heat treatment was carried out.

23. The method as claimed in claim 22, wherein said insulation layer comprises a $SiO_2$ layer.

24. The method as claimed in claim 1, wherein said III-V group semiconductor layer includes at least any one of In and Sb.

25. The method as claimed in claim 1, wherein said first preparation step further includes the step of forming at least a semiconductor contact layer between said III-V group compound semiconductor layer and said thermal stress relaxation layer, said semiconductor contact layer having a rigidity coefficient being sufficiently small for facilitating atomic rearrangements in said contact layer by said heat treatment.

26. The method as claimed in claim 25, wherein said semiconductor contact layer includes at least any one of In and Sb.

27. The method as claimed in claim 1, wherein said first preparation step further includes the step of forming at least an insulation contact layer between said III-V group compound semiconductor layer and said thermal stress relaxation layer to permit a low temperature bonding with a static voltage application.

28. The method as claimed in claim 1, wherein said first preparation step further comprises the steps of:

forming said thermal stress relaxation layer on said silicon layer;

forming said III-V group compound semiconductor layer on a supporting substrate made of the same compound semiconductors as said III-V group compound semiconductor layer; and contacting said thermal stress relaxation layer with said III-V group compound semiconductor layer.

29. The method as claimed in claim 1, wherein said first preparation step comprises the steps of:

forming said III-V group compound semiconductor layer on a supporting substrate made of the same compound semiconductors as said III-V group compound semiconductor layer; and forming said thermal stress relaxation layer on said III-V group compound semiconductor layer; and contacting said thermal stress relaxation layer with said silicon layer.

30. The method as claimed in claim 1, wherein said preparing step comprises forming said intermediate layer to a thickness of at least about 1 micron.

\* \* \* \* \*